(12) United States Patent
Chou et al.

(10) Patent No.: US 8,269,338 B2
(45) Date of Patent: Sep. 18, 2012

(54) SEMICONDUCTOR DEVICE HAVING IMPROVED HEAT DISSIPATION CAPABILITIES

(75) Inventors: Ta-Te Chou, Taipei (TW); Xiong-Jie Zhang, Tianjin (CN); Xian Li, Tianjin (CN); Hai Fu, Tianjin (CN); Yong-Qi Tian, Tianjin (CN)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 11/836,579

(22) Filed: Aug. 9, 2007

(65) Prior Publication Data

US 2008/0036057 A1 Feb. 14, 2008

Related U.S. Application Data

(63) Continuation-in-part of application No. 11/827,042, filed on Jul. 9, 2007.

(60) Provisional application No. 60/837,353, filed on Aug. 11, 2006, provisional application No. 60/836,835, filed on Aug. 10, 2006.

(51) Int. Cl.
*H01L 23/495* (2006.01)
(52) U.S. Cl. .............. 257/706; 257/678; 257/E23.051
(58) Field of Classification Search .............. 257/678, 257/706, E23.051
See application file for complete search history.

(56) References Cited

U.S. PATENT DOCUMENTS

| | | | |
|---|---|---|---|
| 4,951,124 A | 8/1990 | Sawaya | |
| 5,216,283 A | 6/1993 | Lin | |
| 5,299,214 A * | 3/1994 | Nakamura et al. | 372/36 |
| 5,395,800 A * | 3/1995 | Maruyama | 29/827 |
| 5,691,567 A | 11/1997 | Lo et al. | |
| 5,703,399 A | 12/1997 | Majumdar et al. | |
| 6,130,473 A | 10/2000 | Mostafazadeh et al. | |
| 6,387,730 B2 | 5/2002 | Guillot | |
| 6,432,750 B2 | 8/2002 | Jeon et al. | |
| 7,405,467 B2 * | 7/2008 | Liu et al. | 257/672 |
| 7,501,700 B2 * | 3/2009 | Jeun et al. | 257/712 |
| 2001/0048148 A1 * | 12/2001 | Koyama et al. | 257/666 |

(Continued)

FOREIGN PATENT DOCUMENTS

| | | |
|---|---|---|
| JP | 54-162470 | 12/1979 |
| JP | 61-150354 | 7/1986 |
| JP | 06-005737 | 1/1994 |

OTHER PUBLICATIONS

Thermal conductivity of some common materials [online], [retrieved on Dec. 13, 2009]. Retrieved from the Internet <http://www.engineeringtoolbox.com/thermal-conductivity-d_429.html>.

(Continued)

*Primary Examiner* — Kiesha Bryant
*Assistant Examiner* — Peniel Gumedzoe
(74) *Attorney, Agent, or Firm* — Mayer & Williams PC; Karin L. Williams; Stuart H. Mayer

(57) ABSTRACT

A semiconductor device mountable to a substrate includes a semiconductor die and an electrically conductive lead frame having first and second end portions and a first attachment surface and a second attachment surface. The die electrically contacts the first end portion of the lead frame on the first attachment surface. An externally exposed housing encloses the semiconductor die and the first end portion of the lead frame, said housing including a metallic plate facing the second attachment surface of the lead frame.

14 Claims, 20 Drawing Sheets

U.S. PATENT DOCUMENTS

2003/0067065 A1    4/2003   Lee et al.
2003/0075783 A1    4/2003   Yoshihara et al.
2004/0061206 A1    4/2004   Son et al.
2005/0056918 A1*   3/2005   Jeun et al. .................... 257/678

OTHER PUBLICATIONS

"Electronic Components," Asian Sources, Feb. 2000, 3 pages, www.globalsources.com/electroniccomponents.

* cited by examiner

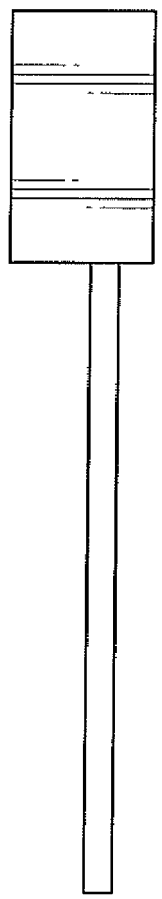
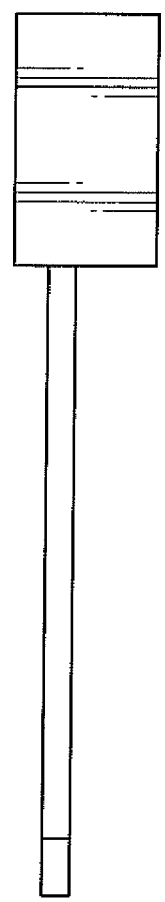
FIG. 18   FIG. 19
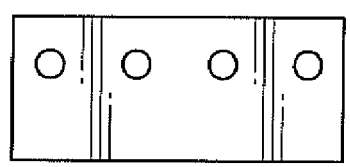
FIG. 20
FIG. 21

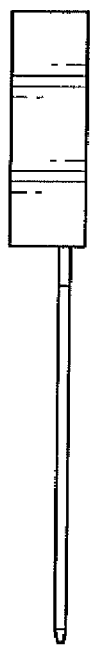
FIG. 25  FIG. 26
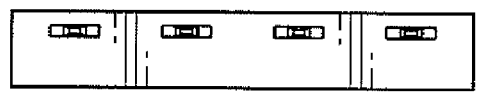
FIG. 27
FIG. 28

 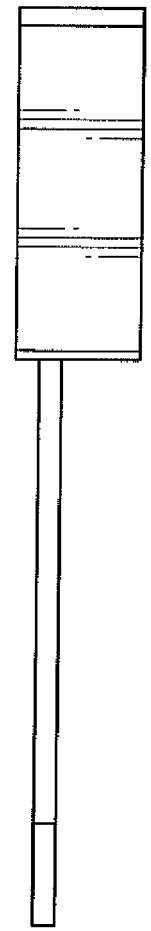
FIG. 39        FIG. 40
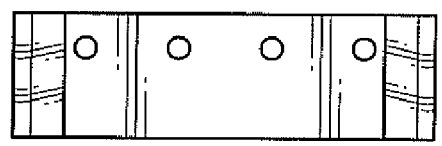
FIG. 41
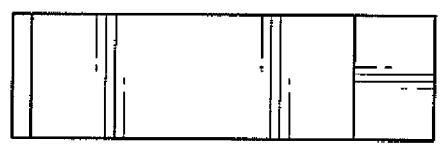
FIG. 42

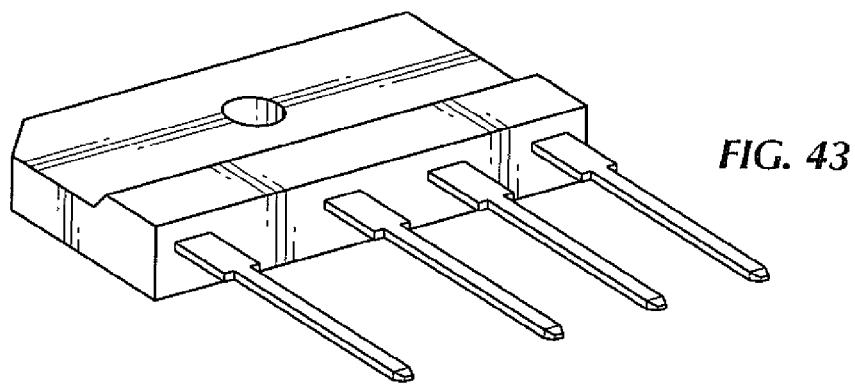
*FIG. 43*
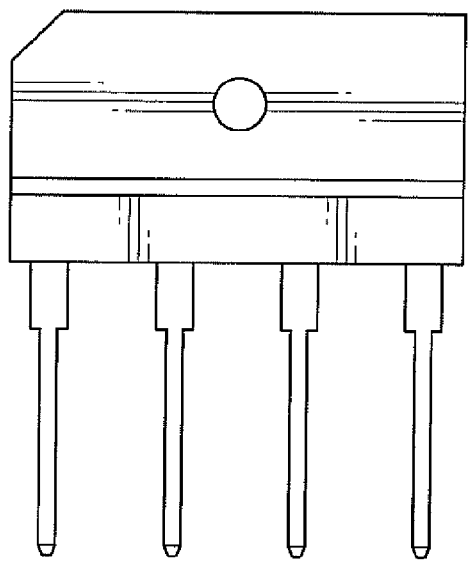 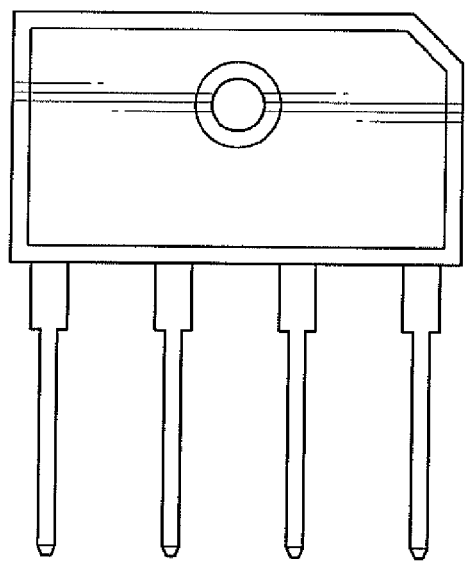
*FIG. 44*   *FIG. 45*

SEMICONDUCTOR DEVICE HAVING IMPROVED HEAT DISSIPATION CAPABILITIES

STATEMENT OF RELATED APPLICATIONS

This application is a Continuation-In-Part of U.S. patent application Ser. No. 11/827,042, filed Jul. 9, 2007, entitled "Semiconductor Device and Method For Manufacturing A Semiconductor Device Having Improved Heat Dissipation Capabilities," which claims the benefit of U.S. Provisional Patent Application Ser. No. 60/837,353, filed Aug. 11, 2006, entitled "Method for Assembling Metal Heat Sink Onto Semiconductor Device."

This application also claims the benefit of U.S. Provisional Patent Application Ser. No. 60/836,835, filed Aug. 10, 2006, entitled "Bridge Rectifier Package With Heat Sink."

Each of the prior applications above is incorporated herein by reference in its entirety.

FIELD OF THE INVENTION

Aspects of this invention relate generally to a semiconductor device and to a method for manufacturing a semiconductor device, and more particularly to a semiconductor device encapsulated in a housing that includes a metallic plate.

BACKGROUND OF THE INVENTION

A major cause of reduced efficiency in semiconductor devices such as rectifiers is inadequate cooling during normal operation. Two ways to alleviate this problem involve the use of a heat sink and a reduction in the wall thickness of the housing that encapsulates the semiconductor device.

FIGS. 1a and 1b are perspective and side views, respectively, of a Vishay® Semiconductor brand single phase inline bridge rectifier device 10 having four semiconductor die inside (not shown), manufactured by Vishay Intertechnology, Inc. Device 10 is through-hole mountable via leads 14, and includes an exterior epoxy housing 12 that protects the semiconductor dies—during operation of device 10, heat generated by the semiconductor dies is transferred through leads 14 and housing 12. FIG. 1B is a side view of device 10, illustrating the through-hole mounting thereof to a substrate 11 (a circuit board, for example), and further illustrating how a heat sink (such as a finned aluminuin plate) 13 may be used to increase the thermal dissipation performance of housing 12—heat generated by dies within housing 12 is transferred to substrate 11 via leads 14, and through housing 12 to heat sink 13 and/or the ambient environment. Device 10, substrate 11, and heat sink 13 are cooled using a cooling technique such as natural or forced-air convection. The thermal conductivity of epoxy housing 12 is much less than that of heat sink 13, however, which often results in device 10 having poor thermal dissipation performance. Unfortunately, the housing 12 is necessary to protect the semiconductor device against moisture as well as assembly process and other environmental contaminants. The housing 12 is commonly formed by encapsulating the semiconductor device in a mold compound, such as a thermosetting plastic, applied by a transfer molding process.

In a typical transfer molding machine used in the semiconductors industry, a thin electronic workpiece mounted on a lead frame is clamped between two halves of a split mold. The mold defines a mold cavity around the device with sufficient clearance to allow mold compound to be injected and flow around the device to encapsulate it. During the molding process mold compound is injected into an inlet and air inside the mold escapes from a vent. A plunger drives the liquefied mold compound into the mold cavity. The mold compound is allowed cure and the mold is opened, releasing the encapsulated semiconductor device.

As previously mentioned, to increase heat dissipation device manufacturers would like to reduce the thickness of the encapsulating layer of the mold compound which encases each device. Thinner encapsulating layers also aid in improving device performance or reliability with regard, resistance to coating damage under thermal stress and other parameters. Another reason thinner encapsulating layers are desired is that in general smaller semiconductor devices are preferred over larger device. However, as the distance between the inner mold surfaces and the electronic workpiece is decreased, it becomes more difficult to obtain a high quality void-free encapsulant around the entire device.

To obtain a void-free seal, the liquefied mold compound must enter the mold inlet and entirely fill the space in the mold cavity before the mold compound flow front arrives at the mold vent. If the mold compound reaches the vent before the mold is completely filled, an air bubble is trapped in the mold, creating a void.

To completely fill the mold cavity, the mold compound must flow between the upper mold surface and the upper surface of the device, between the lower mold surface and the lower surface of the device, and into the space surrounding the outer perimeter of the device. However, as the distance between the upper and lower mold surfaces and the device is reduced, so as to make the encapsulating coating thinner, it becomes more difficult for the mold compound to penetrate these regions.

If this distance is reduced too far, the mold compound will flow around the outer perimeter of the device before the mold compound flow front has displaced the air in the space above and below the device. The result is a void in the encapsulation material as an air bubble is pinched off in the center of the device.

As a result, transfer molding of semiconductor devices with conventional equipment has required that the distance from the inner mold surfaces to the device be at least about 200-250 micrometers. This ensures that there will be laminar flow of the molding compound into the mold and around the device. The exact minimum distance limit is, of course, a function of the specific mold compound used, the fillers it contains and process parameters, such as temperature, but, in general, reducing the distance from the inner mold surfaces to the device to less than some minimum distance results in unacceptable manufacturing losses due to the formation of voids.

FIG. 2 is a cross-sectional view of a semiconductor device 10 such as depicted in FIGS. 1a and 1b. Similar to the device in FIG. 1, device 10 is through-hole mountable via leads 112, and includes an exterior epoxy housing 110 that protects the semiconductor dies 106—during operation of device 10, heat generated by the semiconductor dies 106 is transferred through leads 112 and housing 110. The thermal conductivity of epoxy housing 110 often results in device 10 having poor thermal dissipation performance. A major cause of reduced efficiency in semiconductor devices such as rectifiers is inadequate cooling during normal operation. Unfortunately, as discussed above, if the thickness of the housing is reduced to achieve better thermal conduction, molding failures such as IPE or voids 130 (see FIG. 2) tend to increase, leading to problems such as a failure of a high-potential (hipot) test or electric strength test, which is caused by a breakdown in insulation.

Accordingly, it would be desirable to accommodate both a heat sink and a thinner housing wall in order to adequately dissipate her in a semiconductor device such as a bridge rectifier.

SUMMARY OF THE INVENTION

In accordance with the present invention, a semiconductor device mountable to a substrate is provided. The device includes a semiconductor die and an electrically conductive lead frame having first and second end portions and a first attachment surface and a second attachment surface. The die electrically contacts the first end portion of the lead frame on the first attachment surface. An externally exposed housing encloses the semiconductor die and the first end portion of the lead frame, said housing including a metallic plate facing the second attachment surface of the lead frame.

In accordance with one aspect of the invention, the semiconductor device comprises a power semiconductor device.

In accordance with another aspect of the invention, the power semiconductor device comprises a rectifier. the rectifier comprises a bridge rectifier.

In accordance with another aspect of the invention, the semiconductor device comprises a surface-mountable device.

In accordance with another aspect of the invention, the semiconductor device comprises a through-hole-mountable device.

In accordance with another aspect of the invention, the semiconductor device comprises an integrated circuit.

In accordance with another aspect of the invention, the integrated circuit comprises a chip-scale package.

In accordance with another aspect of the invention, a dielectric, thermally conductive interlayer material is disposed between the metallic plate and the second attachment surface of the lead frame.

In accordance with another aspect of the invention, the interlayer material is a thermally conductive adhesive.

In accordance with another aspect of the invention, the interlayer material comprises a screen printed layer.

In accordance with another aspect of the invention, the housing further comprises a molding compound.

In accordance with another aspect of the invention, a portion of the molding compound is coplanar with the metallic plate.

In accordance with another aspect of the invention the portion of the molding compound coplanar with the metallic plate surrounds the metallic plate.

BRIEF DESCRIPTION OF THE DRAWINGS

FIG. 18 is a left of front view thereof;

FIG. 19 is a right of front view thereof;

FIG. 20 is a front view thereof; and

FIG. 21 is a back view thereof.

FIG. 25 is a left of front view thereof;

FIG. 26 is a right of front view thereof;

FIG. 27 is a front view thereof; and

FIG. 28 is a back view thereof.

FIG. 39 is a left of front view thereof;

FIG. 40 is a right of front view thereof;

FIG. 41 is a front view thereof; and

FIG. 42 is a back view thereof.

FIG. 43 is a perspective view, left top of another embodiment of a semiconductor device constructed in accordance with the present invention;

FIG. 44 is a top view thereof;

FIG. 45 is a bottom view thereof;

DETAILED DESCRIPTION

Figure 3:
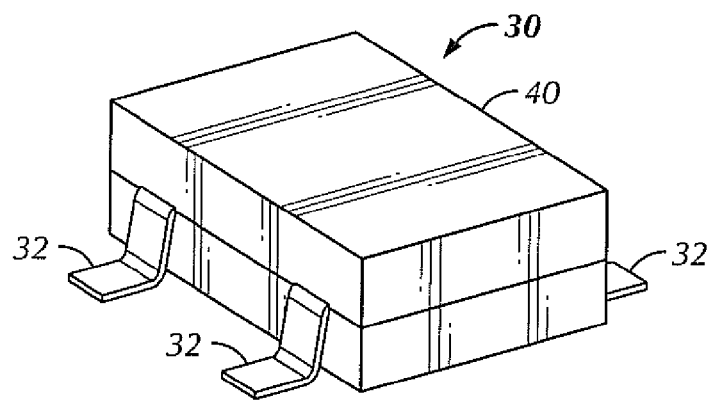
FIG. 3 is a perspective view, left top of one embodiment of a semiconductor device constructed in accordance with the present invention.
Figure 4:
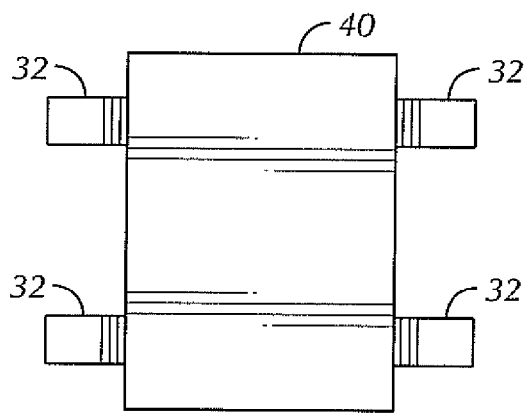
FIG. 4 is a top view thereof.
Figure 5:
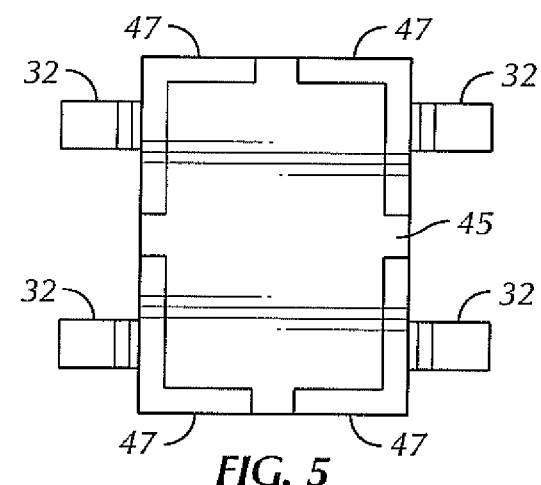
FIG. 5 is a bottom view thereof.
Figure 6:
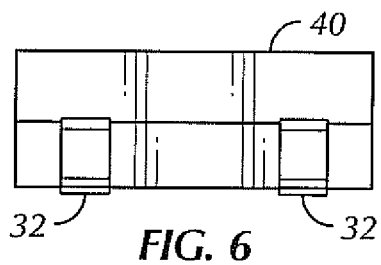
FIG. 6 is a left of front view (right view mirror) thereof.
Figure 7:
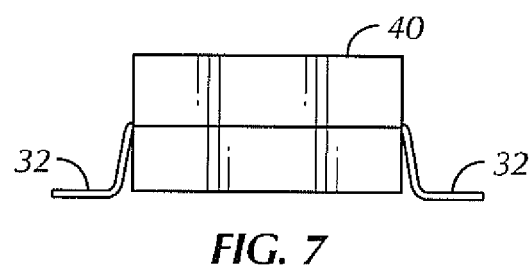
FIG. 7 is a front view (back view mirror) thereof.

FIG. 3 is a perspective view, left top of one embodiment of a surface-mountable semiconductor device 30. In addition, FIGS. 4-7 respectively show a top view, bottom view, left front view (right view mirror), and a front view (back view mirror) of the semiconductor device. 30. The device 30 includes a semiconductor die (not visible in FIGS. 3-7) such as a diode, a MOSFET, or another type of die/integrated circuit, for example. The die is contained within a housing 40. Electrically conductive attachment regions 32 (e.g., lead frames), which electrically contact the die, extend through the housing 40 so that they are externally accessible. Most surfaces of the housing 40 are formed of a material such as a molding compound. However, as shown in FIG. 5, at least a portion of one surface of the housing 40 is formed from a metallic plate 45 that serves as a heat sink. In this embodiment the metallic plate 45 is located on the bottom surface of the device 30. In addition, in this embodiment the bottom surface of the housing 40 also includes a peripheral lip or edge 47 formed from the same material (e.g., a molding compound) as the remainder of the housing. The peripheral edge 47 largely surrounds the metallic plate 45 and may be coplanar therewith.

Figure 56:
FIG. 56 is a back view thereof.

Various views of alternative embodiments of the invention are depicted in FIGS. 3-56.

The semiconductor device 30 may be fabricated in accordance with a wide variety of different techniques and materials. The device 30 may also have a wide variety of different internal configurations. The following examples will present one such configuration constructed in accordance with one particular technique, which is presented by way of example only and not as a limitation on the invention.

Figure 57:
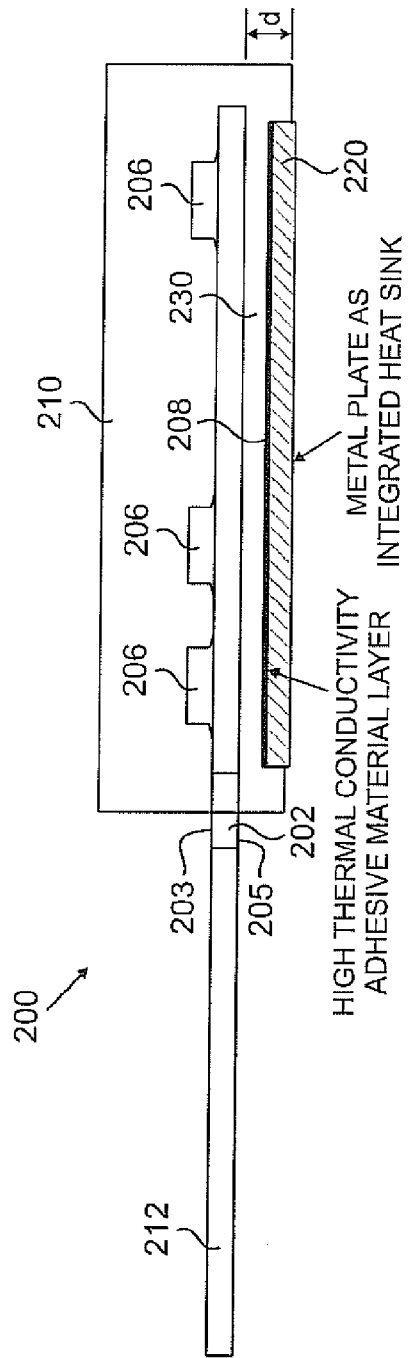
FIG. 57 is a cross-sectional view of the packaging for a through-hole mountable semiconductor device constructed in accordance one aspect of the present invention.

FIG. 57 is a side view of an interior cross-section of a through-hole mountable semiconductor device 200. Electrically conductive attachment regions 202, such as copper pads, solder balls, leads, lead frames, or lead frame terminals, each have one surface 203 arranged to provide electrical communication with a semiconductor die 206 (three dies are visible, although only one die is referenced for exemplary purposes.) Die 206 may be, for example, a diode, a MOSFET, or another type of die/integrated circuit. Surface 203 may be attached to die 206 in any suitable manner, such as by soldering. Through-hole mountable leads 212 (one visible) may also be in electrical communication with semiconductor die 206 and/or electrically conductive attachment region 202.

Figure 1A:
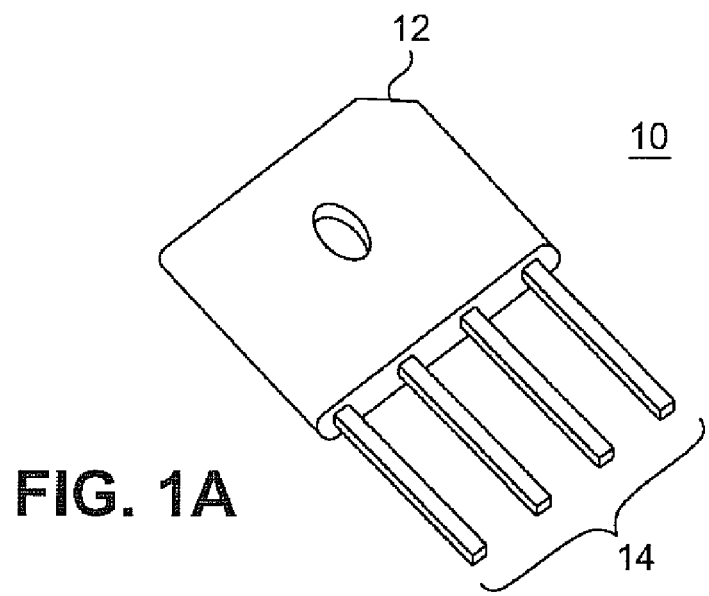
FIGS. 1a and 1b are perspective and side views, respectively, of the packaging for a conventional through-hole mountable semiconductor device.
Figure 1B:
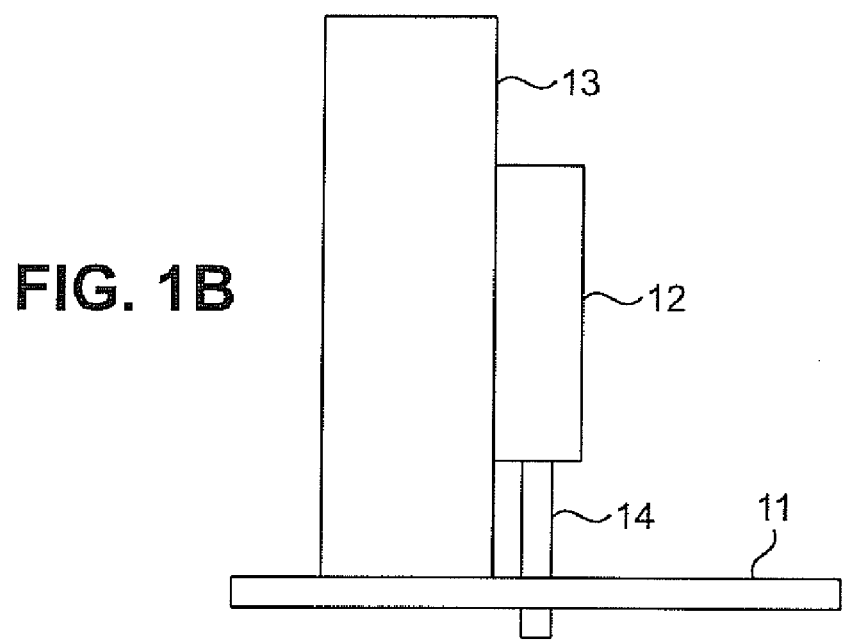
Figure 2:
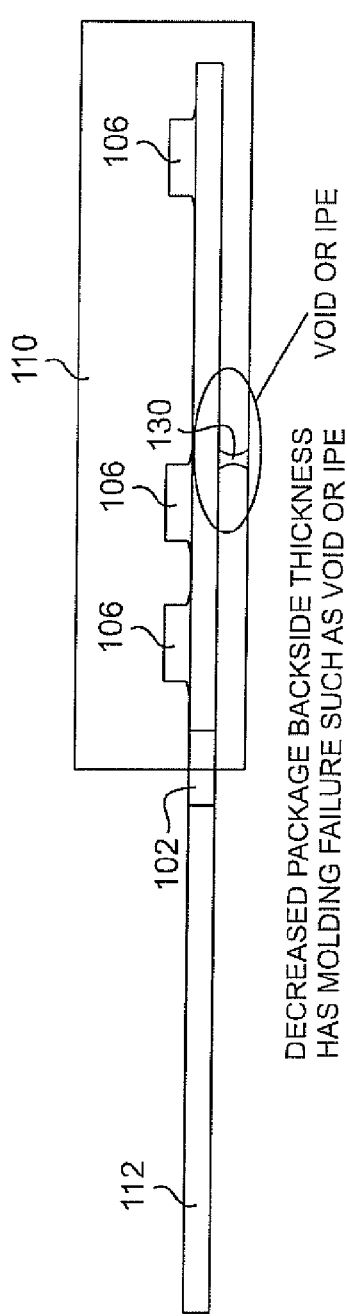
FIG. 2 is a cross-sectional view of the packaging for a conventional through-hole mountable semiconductor device.

A housing 210 at least in part encloses die 206 and electrically conductive attachment regions 202. Housing 210 may be a molding compound, such as a plastic, molded to thermally conductive element 202 and/or interlayer material 206. Housing 210 may be formed in any desired configuration/shape by a variety of well-known methods, such as overmolding or injection molding. As shown, housing 210 is approximately 3.5 mm thick with a configuration similar to portions of exterior housing 12 of semiconductor device 10 (shown in FIG. 1). However, the portion 230 of the housing 210 located between electrically conductive attachment regions 202 and interlayer material 208 (discussed below) is reduced in thickness. That is, the thickness of the housing 210 on the side 205 of the electrically conductive attachment region 202 is substantially thinner than the thickness of the housing 210 on the side 203 of the electrically conductive attachment region 202 on which the die 206 is located.

As further shown in FIG. 57, an interlayer material 208 is coated or otherwise applied to the exposed surface of the housing portion 230 (i.e., the portion of housing 210 on the side 205 of the electrically conductive attachment region 202). The interlayer material 208 has a high dielectric constant and a high thermal conductivity. The interlayer material 208 may take the form of a thermally conductive silicone elastomer material, grease, epoxy, molding compound, elasometric pad, thermal tape, fluid, or gel. For instance, the interlayer material 208 may be a commercially available thermally conductive adhesive such as SE4486 and SE4450 manufactured by DOW CORNING, 282 manufactured by Emerson&Cuming, and SA2000 manufactured by BERGQUIST. Finally, a metal heat sink such as metal plate 220 is secured to the interlayer material 208. The metal plate 220 may be secured by any appropriate means. For example, if the interlayer material 208 is formed from an adhesive, the interlayer material 208 itself may serve to secure the metal plate 220. Thus, the semiconductor device shown in FIG. 57 accommodates both a heat sink and a thinner housing wall, thereby increasing the thermal dissipation of the device so that the device can carry higher currents.

Figure 58:
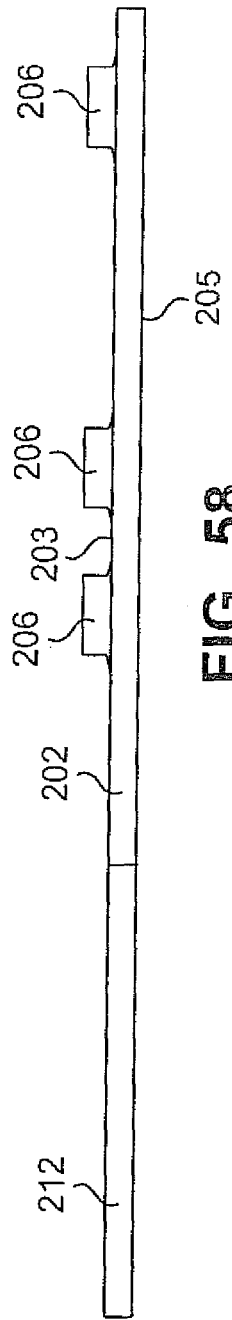
FIGS. 58-61 show cross-sectional views of the through-hole mountable semiconductor device shown in FIG. 3 during the fabrication process.
Figure 59:
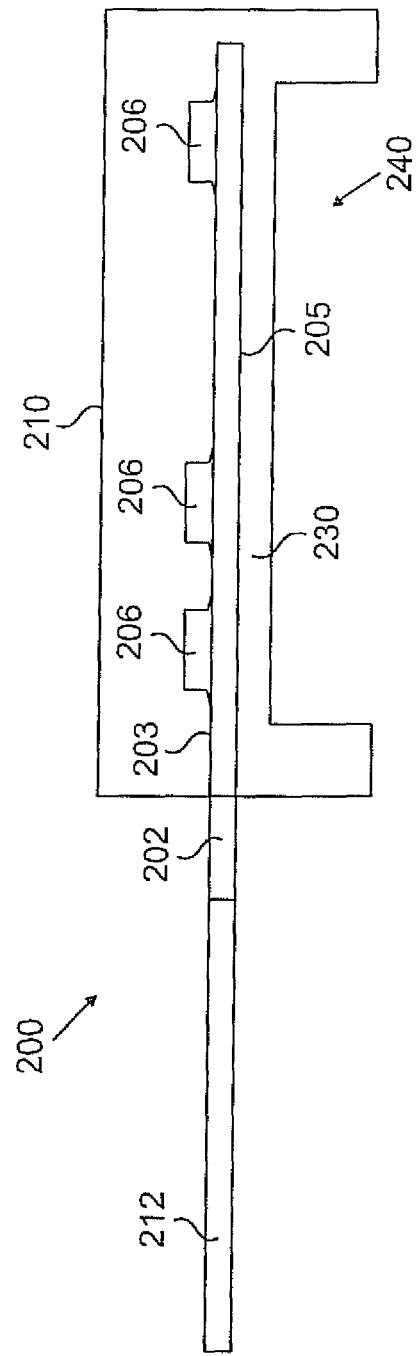
Figure 60:
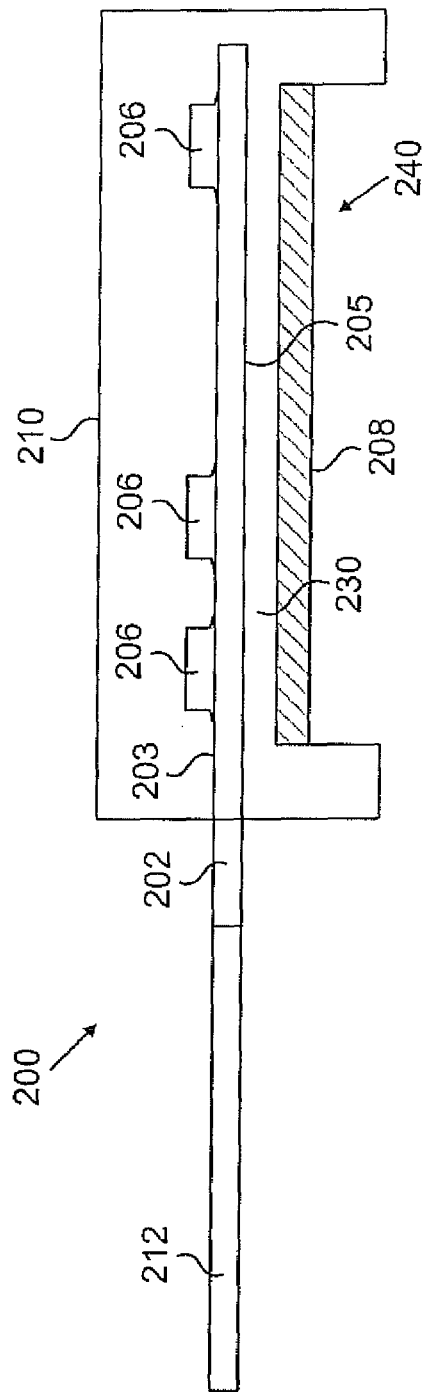
Figure 61:
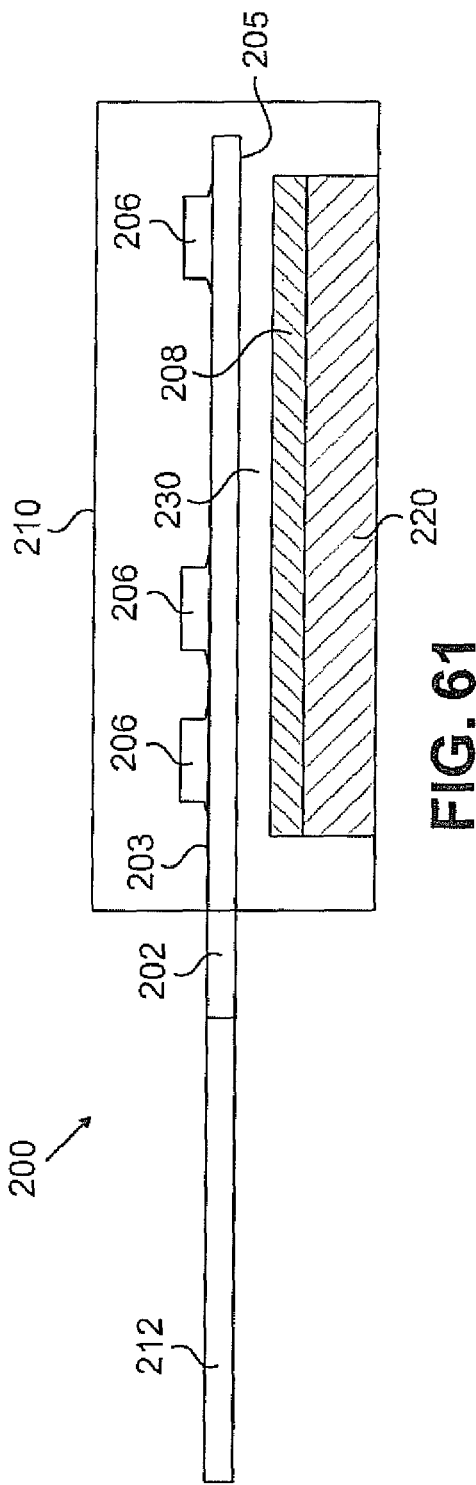

FIGS. 58-61 show cross-sectional views of the through-hole mountable semiconductor device shown in FIG. 57 during the fabrication process. FIG. 58 shows the die 206 mounted to the upper surface of the electrically conductive attachment region 202. In FIG. 59 the housing 210 is formed in an overmolding processes. Housing 210 includes an upper portion that surrounds die 206 and a lower portion 230 that contacts the side 205 of the electrically conductive attachment region 202. A recess 240 is formed in housing portion 230 that will accommodate both the interlayer material 208 and the metal plate 220. FIG. 60 shows the interlayer material 208 located in the recess 240 and FIG. 61 shows the metal plate 220 inserted in the recess 240 and in contact with the interlayer material 208. In many cases the interlayer material 208 may first be applied to the metal plate 220 before inserting the metal plate 220 into the recess 240. Also, as previously mentioned, the interlayer material 208 may serve as an adhesive that secures the metal plate 220 in the recess 240.

By using interlayer material 208 the thickness d of the housing extending from the surface of the electrically conductive attachment region 202 (see FIG. 57) can be advantageously reduced while still avoiding deleterious effects caused to the semiconductor device 200 by IPE (Internal Parts Exposure) or voids. In some cases the housing thickness d can be reduced by 50% or more. For instance, the housing thickness d may be reduced from 1.0 mm to 0.5 mm in thickness. In particular, the semiconductor device 200 can avoid hipot test failures even with such a reduction in housing thickness. The interlayer material 208 effectively acts as a shield providing a high dielectric strength during a hipot test while also allowing good thermal conduction because of its high thermal conductivity.

In some embodiments of the invention the interlayer material 208 is coated or applied to the electrically conductive attachment region 202 using a screen printing process. Screen printing techniques have been widely used in the graphic arts fields to produce art work and have found use in the production of printed circuit boards to transfer relatively large scale mask patterns onto printed circuit boards. Screen printing techniques include the use of a stencil to selectively transfer an image onto a substrate. The image is typically transferred by mechanically pressing a given material through porous (e.g., mesh) portions of the stencil onto a substrate while adjacent non-porous portions of the stencil do not permit printing of the material. Screen printed materials of use in the production of graphic art work include paints and/or inks, while materials of use in the transfer of mask patterns in circuit board production include masking materials. Stencils for use in screen printing are often created by laser milling an image onto a stencil or by photo development processes wherein an image is photo transferred to an undeveloped stencil and the stencil is subsequently developed to reveal the image. An undeveloped stencil typically includes a screen that is coated with a non-porous material. Upon development, portions of the non-porous material are removed yielding porous section of the stencil or yielding apertures in the stencil in the configuration of a photo transferred image. As the image is in effect transferred to the developed stencil, the stencil is then of use to transfer the same image to a substrate as discussed above. The techniques of screen printing and the use of stencils in such printing are well known and therefore, will not be discussed in any greater detail.

Thus semiconductor devices have been described that include enhanced heat removal paths created by reducing the thickness of the housing that encapsulates the die or dies as well as by providing a metal heat sink. Conducting heat away from mounting substrates is desirable in product designs that feature increased component densities, and thus increased heat flux densities, on each substrate—cooling provided for the substrate, which generally results in a single operating temperature being provided for a relatively large surface area, is supplemented by the electrically isolated semiconductor device package itself. Semiconductor devices may operate at more desirable temperatures without significant alterations in their footprints, and/or without additional isolation requirements, reducing the need for product re-designs.

Figure 8:
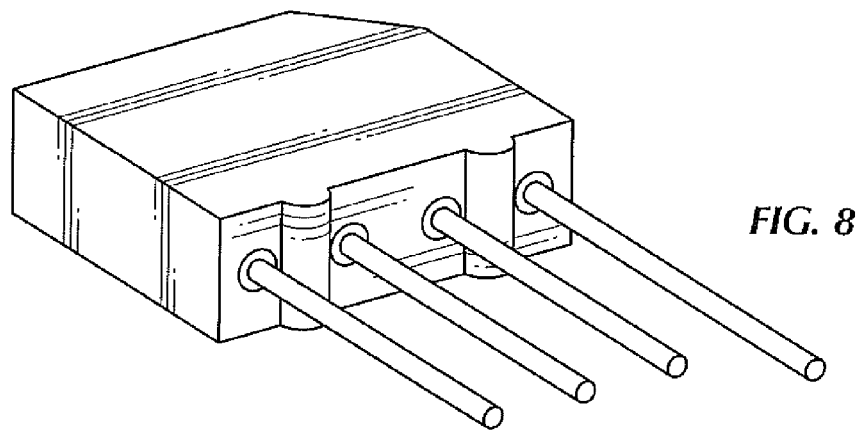
FIG. 8 is a perspective view, left top of another embodiment of a semiconductor device constructed in accordance with the present invention.
Figure 9:
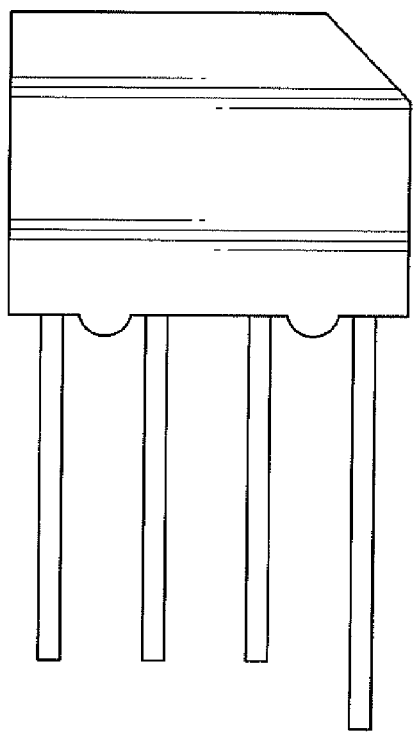
FIG. 9 is a top view thereof.
Figure 10:
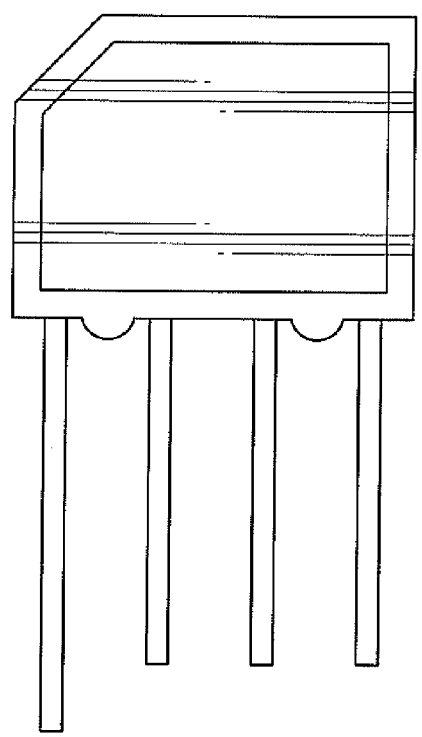
FIG. 10 is a bottom view thereof.
Figure 11:
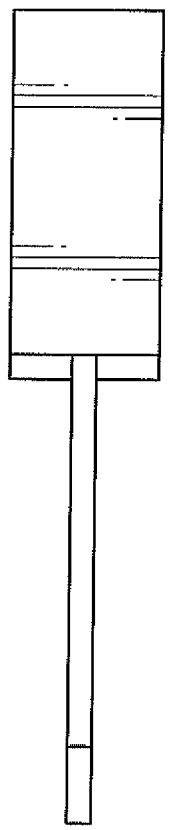
FIG. 11 is a left of front view thereof.
Figure 12:
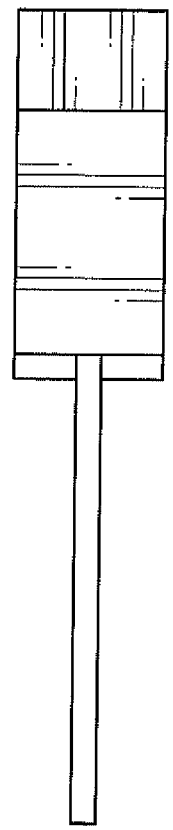
FIG. 12 is a right of front view thereof.
Figure 13:
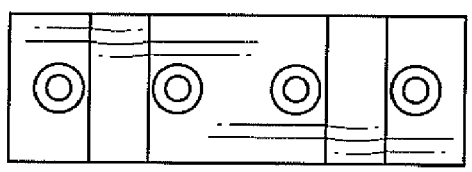
FIG. 13 is a front view thereof.
Figure 14:
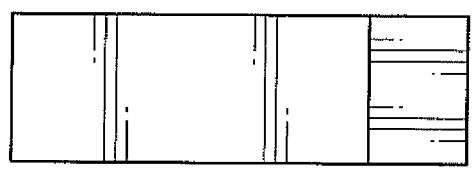
FIG. 14 is a back view thereof.
Figure 15:
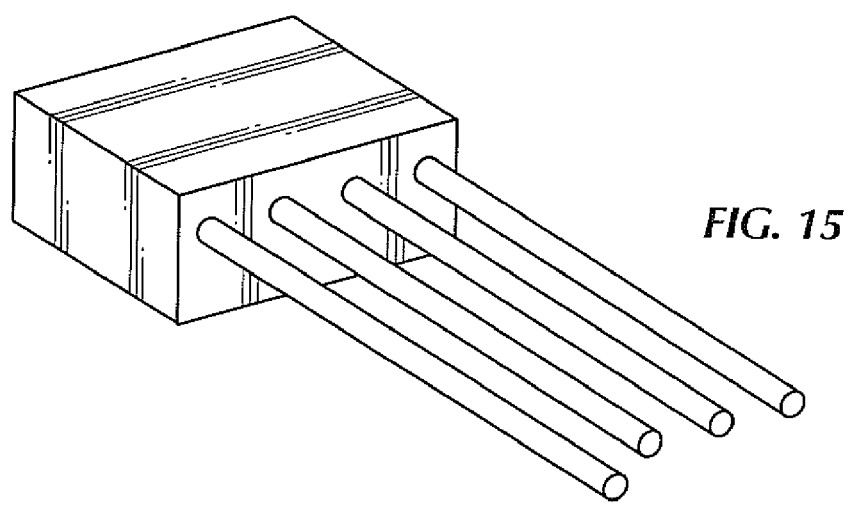
FIG. 15 is a perspective view, left top of another embodiment of a semiconductor device constructed in accordance with the present invention.
Figure 16:
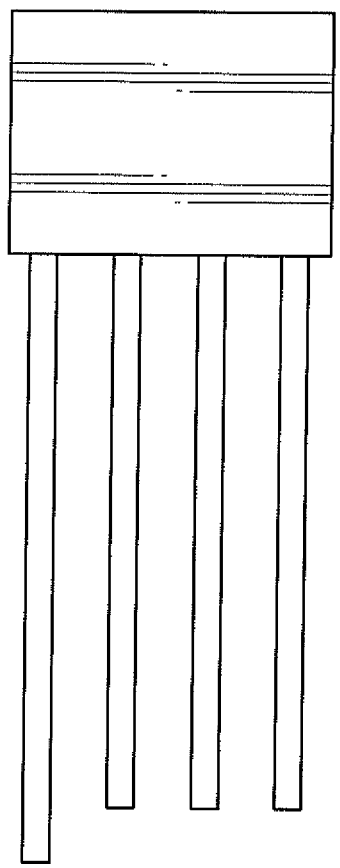
FIG. 16 is a top view thereof.
Figure 17:
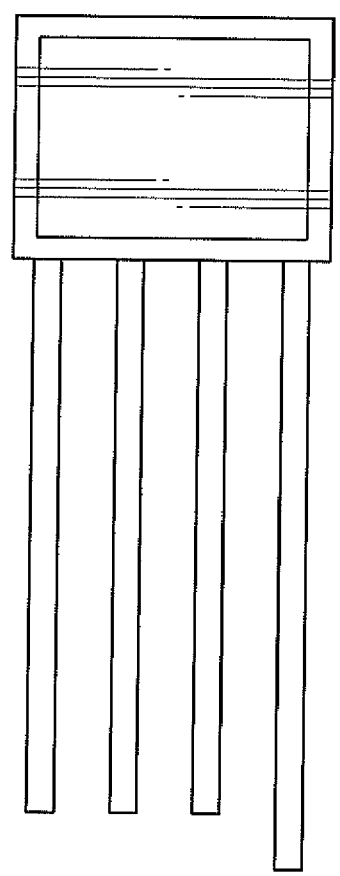
FIG. 17 is a bottom view thereof.
Figure 22:
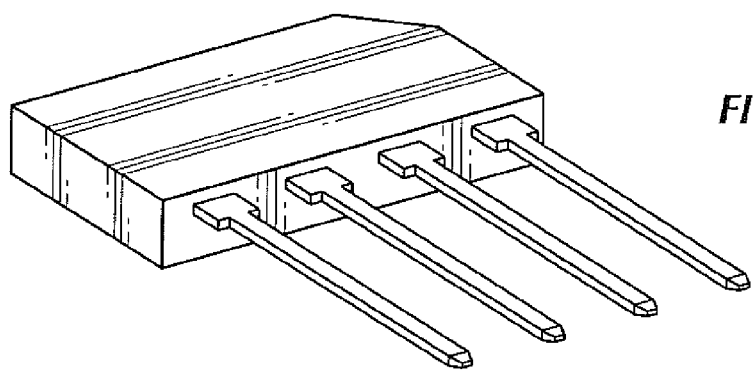
FIG. 22 is a perspective view, left top of another embodiment of a semiconductor device constructed in accordance with the present invention.
Figure 23:
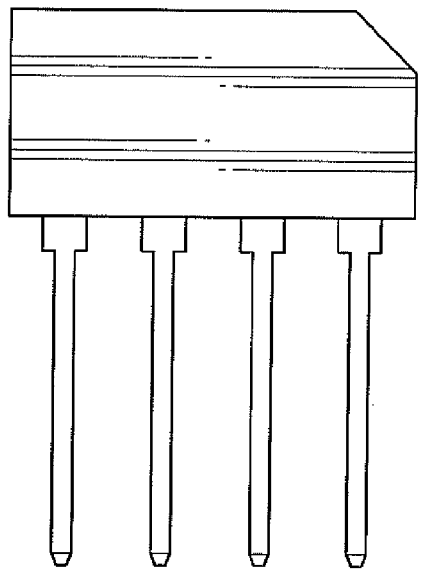
FIG. 23 is a top view thereof.
Figure 24:
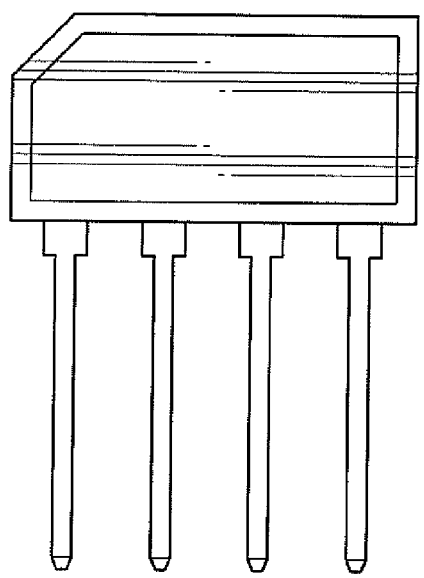
FIG. 24 is a bottom view thereof.
Figure 29:
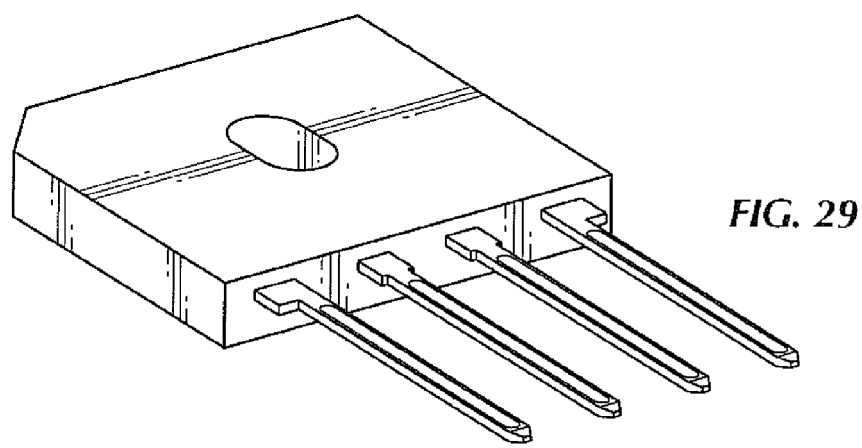
FIG. 29 is a perspective view, left top of another embodiment of a semiconductor device constructed in accordance with the present invention.
Figure 30:
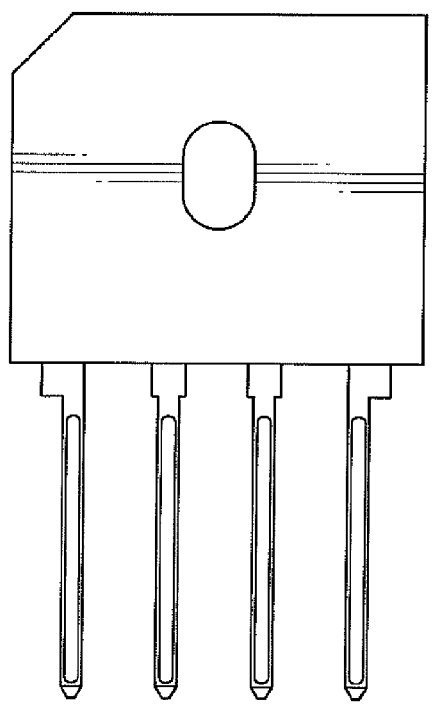
FIG. 30 is a top view thereof.
Figure 31:
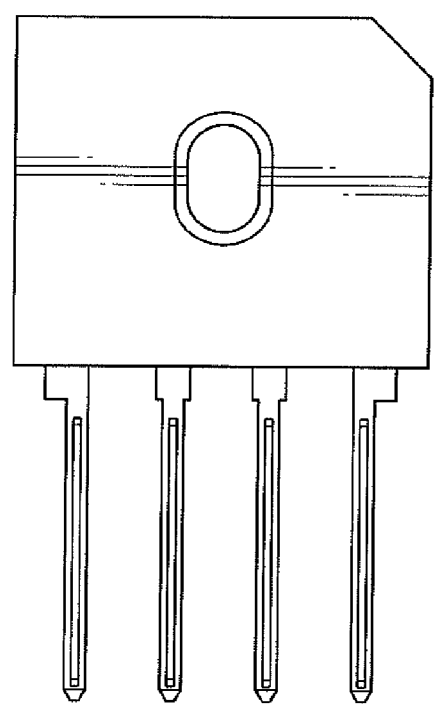
FIG. 31 is a bottom view thereof.
Figure 32:
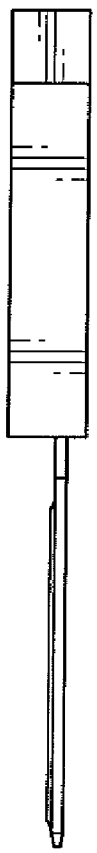
FIG. 32 is a left of front view thereof.
Figure 33:
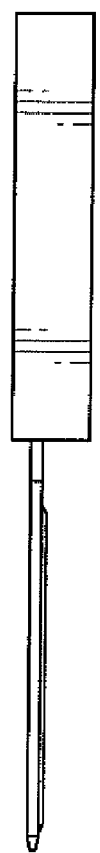
FIG. 33 is a right of front view thereof.
Figure 34:
FIG. 34 is a front view thereof.
Figure 35:
FIG. 35 is a back view thereof.
Figure 36:
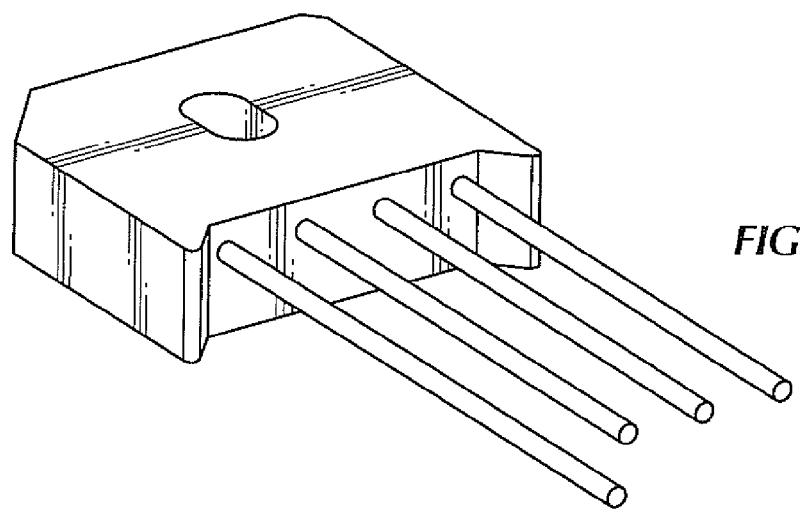
FIG. 36 is a perspective view, left top of another embodiment of a semiconductor device constructed in accordance with the present invention.
Figure 37:
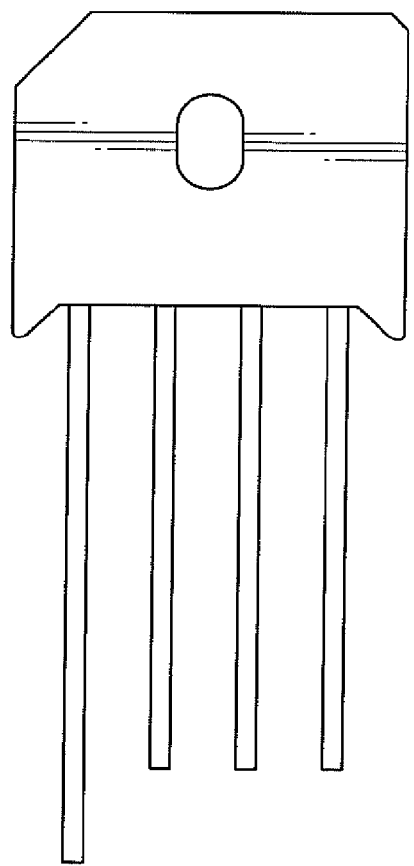
FIG. 37 is a top view thereof.
Figure 38:
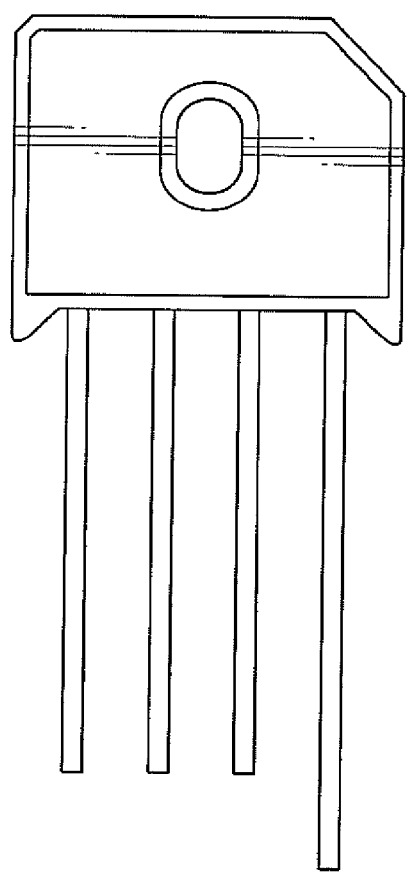
FIG. 38 is a bottom view thereof.
Figure 46:
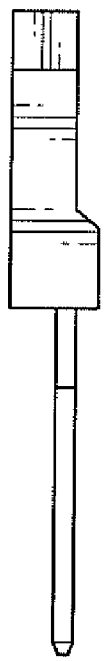
FIG. 46 is a left of front view thereof.
Figure 47:
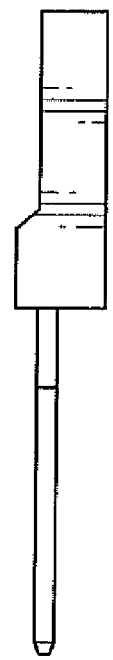
FIG. 47 is a right of front view thereof.
Figure 48:
FIG. 48 is a front view thereof.
Figure 49:
FIG. 49 is a back view thereof.
Figure 50:
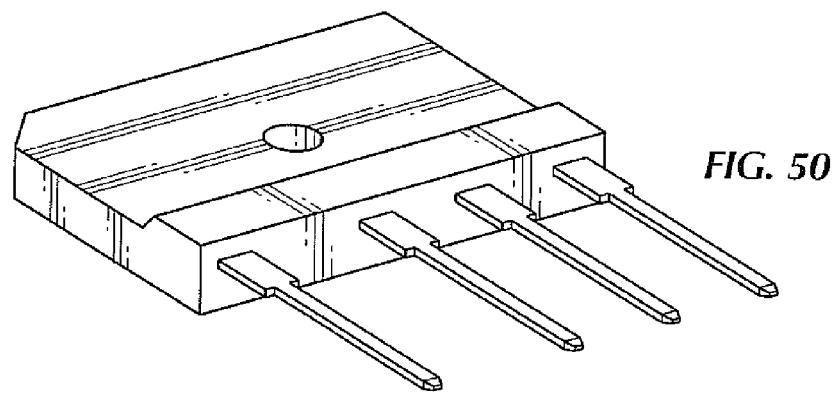
FIG. 50 is a perspective view, left top of another embodiment of a semiconductor device constructed in accordance with the present invention.
Figure 51:
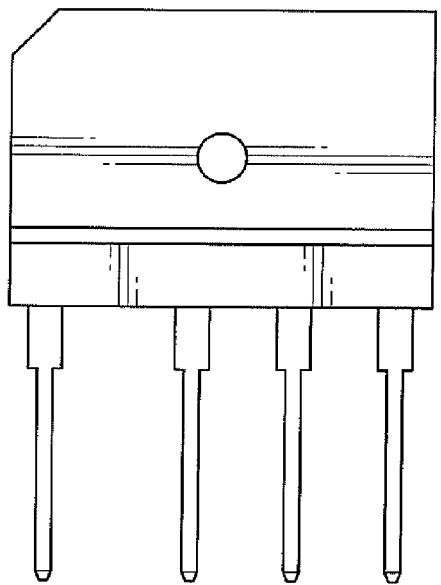
FIG. 51 is a top view thereof.
Figure 52:
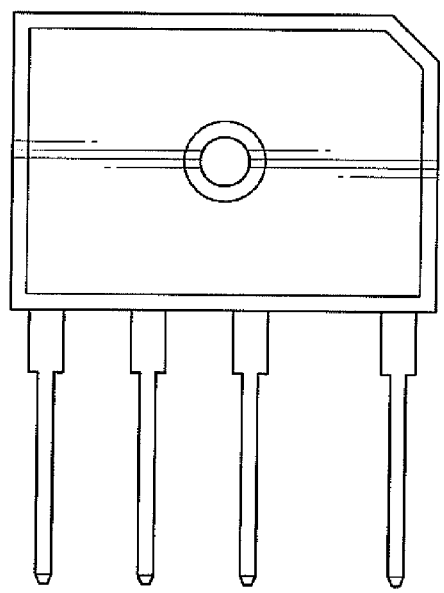
FIG. 52 is a bottom view thereof.
Figure 53:
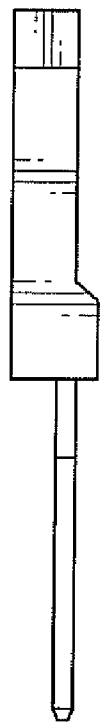
FIG. 53 is a left of front view thereof.
Figure 54:
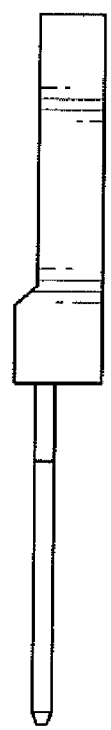
FIG. 54 is a right of front view thereof.
Figure 55:
FIG. 55 is a front view thereof.

Aspects of the present invention described above with respect to a through-hole mountable semiconductor devices are also applicable to surface-mountable semiconductor devices, such as shown, for example, in FIG. 8 of copending U.S. application Ser. No. 11/827,041.

Figure 62:
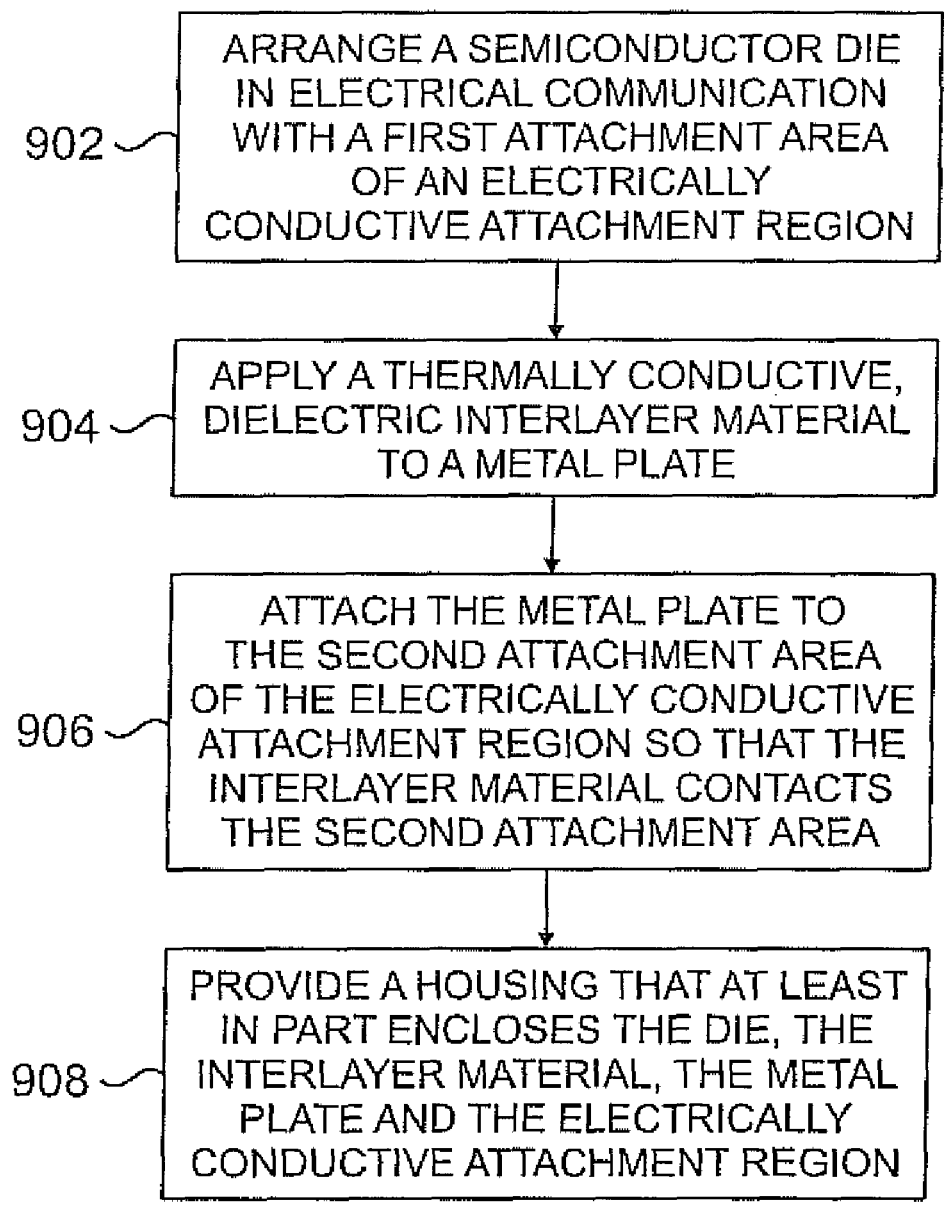
FIG. 62 is a flowchart of a method for fabricating a semiconductor device in accordance with aspects of the present invention.

FIG. 62 is a flowchart of a method for manufacturing a semiconductor device such as the semiconductor device 200 shown in FIG. 57 in accordance with aspects of the present invention. The method begins at block 902, where a semiconductor die is arranged for electrical communication with a first attachment area of an electrically conductive attachment region, such as a copper pad, a lead frame, or a terminal thereof.

Next, at block 904, a thermally conductive, dielectric interlayer material is applied to a metal plate that serves as a heat sink. The interlayer material may be coated onto the metal plate and may serve as an adhesive. At step 906 the metal plate is attached to the second attachment area of the electrically conductive attachment region so that the interlayer material contacts the second attachment area. If the interlayer material is an adhesive, it may serve to secure the metal plate to the second attachment area.

At block 908, a housing, which may be composed of a material such as plastic, is provided that at least in part encloses the die, the interlayer material, the metal plate and the electrically conductive attachment region. The housing is affixed (by molding, for example) in such a manner that exterior packaging of the semiconductor device is provided by the housing. The thickness of the housing extending from the electrically conductive attachment region may be less than would otherwise be possible while still avoiding problems (e.g. electrical insulation breakdowns) caused by voids and the like if the interlayer material and the metal plate were not employed.

It will be apparent that other and further forms of the aspects of the present invention described herein may be devised without departing from the spirit and scope of the appended claims, and it will be understood that aspects of this invention are not to be limited to the specific embodiments described above.

The invention claimed is:

1. A semiconductor device mountable to a substrate, comprising:
   a semiconductor die;
   an electrically conductive lead frame having first and second end portions and a first attachment surface and a second attachment surface, wherein the semiconductor die electrically contacts the first end portion of the lead frame on the first attachment surface; and
   an externally exposed housing enclosing the semiconductor die and the first end portion of the lead frame, said housing including a metallic plate facing the second attachment surface of the lead frame;
   wherein a portion of said housing lies between said second attachment surface of the lead frame and the metallic plate,
   wherein said housing comprises a single type of molding compound, and
   further wherein a thickness of said housing located on the side of the second attachment surface, extending from the second attachment surface to a bottom, outer portion of the metallic plate, is substantially thinner than a thickness of said housing located on the side of the first attachment surface.

2. The semiconductor device according to claim 1, wherein the semiconductor device comprises a power semiconductor device.

3. The semiconductor device according to claim 2, wherein the power semiconductor device comprises a rectifier.

4. The semiconductor device according to claim 3, wherein the rectifier comprises a bridge rectifier.

5. The semiconductor device according to claim 1, wherein the semiconductor device comprises a surface-mountable device.

6. The semiconductor device according to claim 1, wherein the semiconductor device comprises a through-hole-mountable device.

7. The semiconductor device according to claim 1, wherein the semiconductor device comprises an integrated circuit.

8. The semiconductor device according to claim 7, wherein the integrated circuit comprises a chip-scale package.

9. The semiconductor device according to claim 8, further comprising a dielectric, thermally conductive interlayer material, having a high thermal conductivity, disposed between the metallic plate and the second attachment surface of the lead frame.

10. The semiconductor device according to claim 9, wherein the interlayer material is a thermally conductive adhesive.

11. The semiconductor device according to claim 9, wherein the interlayer material comprises a screen printed layer.

12. The semiconductor device according to claim 1, wherein the housing further comprises a single type of molding compound.

13. The semiconductor device according to claim 12, wherein a portion of the molding compound is coplanar with the metallic plate.

14. The semiconductor device according to claim 13, wherein the portion of the molding compound coplanar with the metallic plate surrounds the metallic plate.

* * * * *